United States Patent
Jeong et al.

(10) Patent No.: US 11,849,270 B2
(45) Date of Patent: *Dec. 19, 2023

(54) ELECTRONIC DEVICE WITH SEALING STRUCTURE

(71) Applicant: SAMSUNG ELECTRONICS CO., LTD., Suwon-si (KR)

(72) Inventors: Wontae Jeong, Suwon-si (KR); Eungkyu Park, Suwon-si (KR); Dongyeop Lee, Suwon-si (KR); Yonghwa Kim, Suwon-si (KR); Gihoon Lee, Suwon-si (KR); Jaehwan Lee, Suwon-si (KR); Seungbum Choi, Suwon-si (KR); Hyounggil Choi, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,787

(22) Filed: Sep. 20, 2022

(65) Prior Publication Data
US 2023/0020693 A1 Jan. 19, 2023

Related U.S. Application Data

(63) Continuation of application No. 16/510,733, filed on Jul. 12, 2019, now Pat. No. 11,470,409.

(30) Foreign Application Priority Data

Sep. 12, 2018 (KR) .................. 10-2018-0108821

(51) Int. Cl.
*H05K 5/00* (2006.01)
*H05K 5/02* (2006.01)
(Continued)

(52) U.S. Cl.
CPC ............. *H04R 1/025* (2013.01); *H01F 38/14* (2013.01); *H01M 50/209* (2021.01);
(Continued)

(58) Field of Classification Search
None
See application file for complete search history.

(56) References Cited

U.S. PATENT DOCUMENTS

| 9,124,348 B2 | 9/2015 | Kimura et al. |
| 10,084,165 B2 | 9/2018 | Fukushima et al. |

(Continued)

FOREIGN PATENT DOCUMENTS

| CN | 102263208 A | 11/2011 |
| CN | 202798844 U | 3/2013 |

(Continued)

OTHER PUBLICATIONS

International Search Report dated Oct. 17, 2019 in connection with International Patent Application No. PCT/KR2019/008388, 3 pages.

(Continued)

*Primary Examiner* — James Wu
*Assistant Examiner* — Christopher L Augustin

(57) ABSTRACT

An electronic device may include: a housing including a front plate oriented in a first direction, a rear plate oriented in a second direction opposite the first direction, and a side member enclosing at least a part of a space between the front plate and the rear plate. The electronic device further including a display disposed to be visible through the front plate; a printed circuit board disposed between the display and the rear plate; a support structure having a first face oriented in the first direction and supporting the display and a second face oriented in the second direction and supporting the printed circuit board; a conductive member disposed between the support structure and the rear plate; and a (Continued)

sealing structure disposed between the conductive member and the rear plate, the sealing structure extending along a periphery of the conductive member and formed in a closed curve shape.

15 Claims, 26 Drawing Sheets

(51) Int. Cl.
| | |
|---|---|
| H05K 5/03 | (2006.01) |
| H05K 5/06 | (2006.01) |
| H04R 1/02 | (2006.01) |
| H01F 38/14 | (2006.01) |
| H01M 50/24 | (2021.01) |
| H01M 50/209 | (2021.01) |

(52) U.S. Cl.
CPC .......... *H01M 50/24* (2021.01); *H05K 5/0004* (2013.01); *H05K 5/0017* (2013.01); *H05K 5/0086* (2013.01); *H05K 5/0247* (2013.01); *H05K 5/03* (2013.01); *H05K 5/069* (2013.01); *H01M 2220/30* (2013.01); *H04R 2499/01* (2013.01)

(56) References Cited

U.S. PATENT DOCUMENTS

| | | | |
|---|---|---|---|
| 10,211,873 B2 | 2/2019 | Xu et al. | |
| 2011/0293981 A1 | 12/2011 | Fang et al. | |
| 2013/0217444 A1* | 8/2013 | Lee | G06F 1/1626 |
| | | | 455/566 |
| 2013/0267170 A1 | 10/2013 | Chong et al. | |
| 2015/0005042 A1 | 1/2015 | Lee et al. | |
| 2016/0021444 A1* | 1/2016 | Behles | H04R 1/288 |
| | | | 381/354 |
| 2017/0099742 A1 | 4/2017 | Choi et al. | |
| 2017/0135239 A1 | 5/2017 | Hyun et al. | |
| 2018/0084337 A1 | 3/2018 | Schmidt | |
| 2018/0109132 A1 | 4/2018 | Cho et al. | |
| 2018/0183112 A1 | 6/2018 | Cheong et al. | |

FOREIGN PATENT DOCUMENTS

| | | |
|---|---|---|
| CN | 107833994 A | 3/2018 |
| JP | 2012-195835 A | 10/2012 |
| KR | 10-2015-0008954 A | 1/2015 |
| KR | 10-2018-0042919 A | 4/2018 |
| WO | 2018088773 A1 | 5/2018 |

OTHER PUBLICATIONS

Written Opinion of the International Searching Authority dated Oct. 17, 2019 in connection with International Patent Application No. PCT/KR2019/008388, 5 pages.

Supplementary European Search Report dated Jun. 29, 2021, in connection with European Patent Application No. 19859456.6, 11 pages.

Notice of Preliminary Rejection dated Dec. 2, 2022 in connection with Korean Patent Application No. 10-2018-0108821, 18 pages.

Korean Intellectual Property Office, "Notice of Patent Grant," dated May 15, 2023, in connection with Korean Patent Application No. KR10-2018-0108821, 5 pages.

* cited by examiner

ELECTRONIC DEVICE WITH SEALING STRUCTURE

CROSS-REFERENCE TO RELATED APPLICATIONS

This application is a continuation of application Ser. No. 16/510,733, filed Jul. 12, 2019, which is based on and claims priority under 35 U.S.C. 119 to Korean Patent Application No. 10-2018-0108821, filed Sep. 12, 2018, in the Korean Intellectual Property Office, the disclosure of which are herein incorporated by reference in their entirety.

BACKGROUND

1. Field

Various embodiments relate to a sealing structure that reduces the amount of vibration generated in a rear cover portion when an open-type speaker mounted on an electronic device is applied.

2. Description of Related Art

The above information is presented as background information only to assist with an understanding of the disclosure. No determination has been made, and no assertion is made, as to whether any of the above might be applicable as prior art with regard to the disclosure.

Various types of speakers may be mounted on electronic devices, and a lower speaker that serve as a main speaker and an upper speaker (receiver) that transmits call sound may be arranged in an electronic device.

The lower speaker may be a closed-type speaker. In the case of a closed-type speaker, the speaker unit itself additionally has a separate enclosure structure. The separate enclosure may serve to prevent air pressure generated during operation of the speaker unit from spreading out.

Thanks to this role, the speaker enclosure plays an important role in speaker sound performance, and generally, it is possible to make the sound of a low frequency band better when the air volume of the enclosure is larger. In contrast, in the case of an open-type speaker such as an upper speaker (receiver), the speaker unit itself does not have an additional enclosure structure. In this case, the volume of the inner space of a set in which the open-speaker is mounted may also be used to play a role of a separate enclosure in a closed-type speaker unit.

However, since the upper speaker unit does not have a separate enclosure structure, the air inside the electronic device is compressed/expanded during the operation of the speaker. The compression/expansion of the air caused by the operation of the upper speaker is transmitted through the medium of air to the entire space inside the electronic device, causing vibration in all parts, and also causing great vibration in the rear cover (e.g., the rear glass) on the rear side of the electronic device.

When the rear glass vibration greatly occurs, when a user listens to music through the electronic device, the vibration may be transmitted through a hand holding the electronic device, which may cause discomfort. In addition, even when listening to music in the state in which the electronic device is mounted on a desk, there is a disadvantage in that additional noise may occur due to vibration between the rear glass on the rear side of the electronic device and the upper face of the desk.

In order to reduce the vibration of a rear glass to a predetermined level or lower, artificial audio tuning is performed to reduce the performance of the speaker at the upper end before product launch. This audio tuning results in reduction of sound performance of the speaker, thereby causing a great loss in terms of audio of the product.

SUMMARY

The disclosure provides an electronic device having a sealing structure that reduces vibrations of the rear glass caused by an open-type speaker.

An electronic device according to various embodiments may include: a housing including a front plate oriented in a first direction, a rear plate oriented in a second direction opposite the first direction, and a side member enclosing at least a part of a space between the front plate and the rear plate; a display disposed such that at least a portion thereof is visible through the front plate; a printed circuit board disposed between the display and the rear plate; a support structure having a first face oriented in the first direction and supporting the display and a second face oriented in the second direction and supporting the printed circuit board, the support structure being coupled to at least a portion of the housing; a conductive member disposed between the support structure and the rear plate; and a sealing structure disposed between the conductive member and the rear plate, the sealing structure extending along a periphery of the conductive member and formed in a closed curve shape when viewed from above support structure.

An electronic device according to various embodiments may include: a housing including a front plate oriented in a first direction, a rear plate oriented in a second direction opposite the first direction, and a side member enclosing at least a part of a space between the front plate and the rear plate; a display disposed such that at least a portion thereof is visible through the front plate; a printed circuit board disposed between the display and the rear plate; a support structure having a first face oriented in the first direction and supporting the display and a second face oriented in the second direction and supporting the printed circuit board, the support structure being coupled to at least a portion of the housing; a battery disposed parallel to the printed circuit board so as not to overlap the printed circuit board, the battery being supported in an accommodation portion in the support member; and a first sealing structure disposed between the support structure and the battery and extending along an edge of the battery.

According to various embodiments, when using an open-type speaker disposed in the upper area of the electronic device, it is possible to improve audio performance of the electronic device by reducing the vibration occurring in a rear glass portion on the rear side of the electronic device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or: the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like: and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
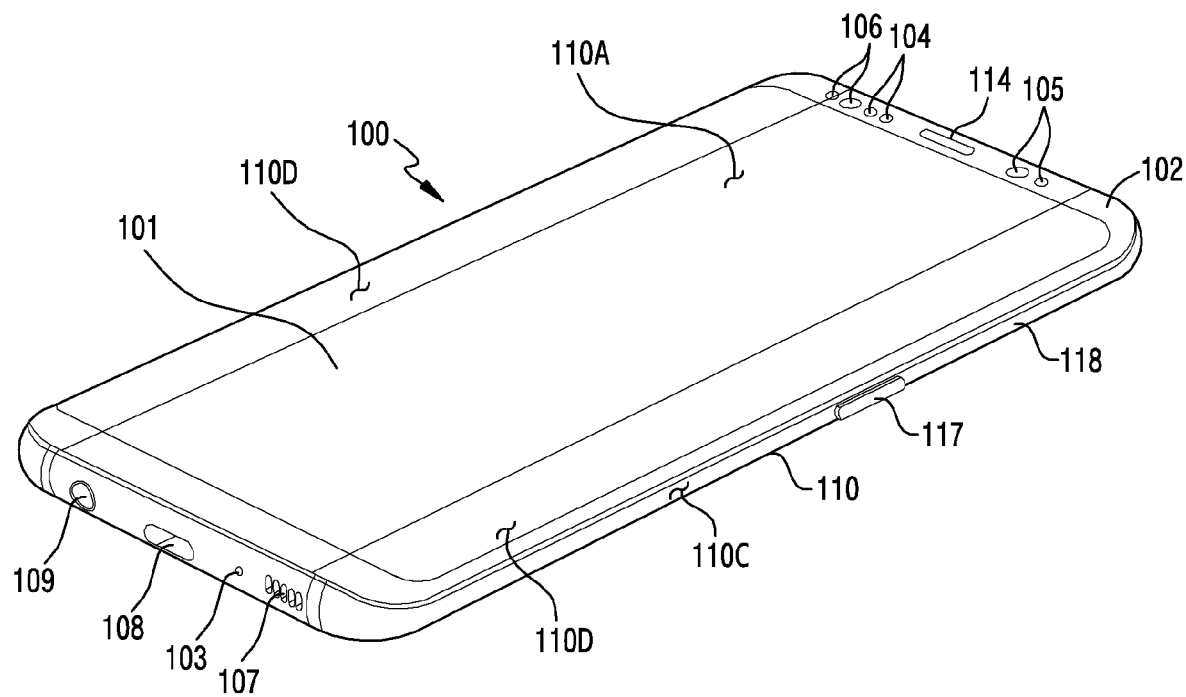
FIG. 1 illustrates a perspective view of the front face of a mobile electronic device according to an embodiment.

FIGS. 1 through 13B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, it should be understood that there is no intent to limit the disclosure to the particular forms disclosed herein; rather, the disclosure should be construed to cover various modifications, equivalents, and/or alternatives of embodiments of the disclosure. In describing the drawings, similar reference numerals may be used to designate similar constituent elements.

For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and a wearable device (e.g., a head-mounted-device (HMD) such as electronic glasses, electronic clothes, an electronic bracelet, an electronic necklace, an electronic accessory, electronic tattoos, or a smart watch).

Figure 2:
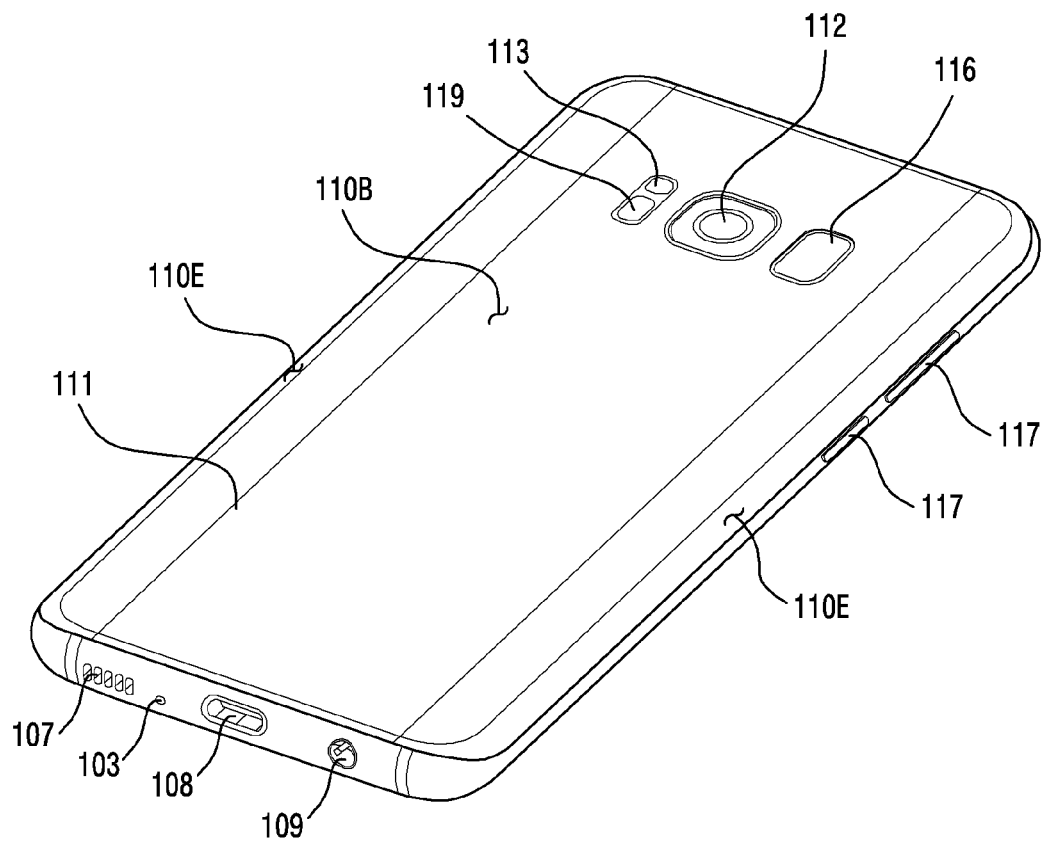
FIG. 2 illustrates a perspective view of the rear face of the electronic device of FIG. 1.

FIG. 1 illustrates a perspective view of the front face of a mobile electronic device according to an embodiment. FIG. 2 illustrates a perspective view of the rear face of the electronic device of FIG. 1.

Referring to FIGS. 1 and 2, an electronic device 100 according to an embodiment may include: a housing 110 including a first face (or a front face) 110A, a second face (or a rear face) 110B, and a side face 110C surrounding a space between the first face 110A and the second face 110B. In another embodiment (not illustrated), the term, housing, may refer to a structure forming some of the first face 110A, the second face 110B, and the side face 110C of FIG. 1. According to an embodiment, at least a portion of the first face 110A may be formed by a substantially transparent front plate 102 (e.g., a glass plate or a polymer plate including various coating layers). The second face 110B may be formed of a substantially opaque rear plate 111. The rear plate 111 may be formed of, for example, coated or colored glass, ceramic, a polymer, or a metal (e.g., aluminum, stainless steel (STS), or magnesium), or a combination of two or more of these materials. The side faces 110C may be formed by a side bezel structure (or a "side member") 118 coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include two first areas 110D, which are bent from the first face 110A toward the rear plate 111 and extend seamlessly, at the long opposite side edges thereof. In the illustrated embodiment (see FIG. 2), the rear plate 111 may include two second areas 110E, which are bent from the second face 110B toward the front plate 102 and extend seamlessly, at the long opposite side edges thereof. In some embodiments, the front plate 102 (or the rear plate 111) may include only one of the first areas 110D (or the second areas 110E). In another embodiment, some of the first areas 110D and the second areas 110E may not be included. In the above embodiments, when viewed from a side of the electronic device 100, the side bezel structure 118 may have a first thickness (or width) on the side faces, which do not include the first areas 110D or the second areas 110E, and may have a second thickness (or width), which is thinner than the first thickness, on the side faces which include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, in the electronic device 100, at least one of the components ((e.g., the key input devices 117 or the light-emitting element 116) may be omitted, or other components may be additionally included.

The display 101 may be exposed through, for example, a large portion of the front plate 102. In some embodiments, at least a part of the display 101 may be exposed through the front plate 102 forming the first face 110A and the first areas 110D of the side faces 110C. In some embodiments, the edges of the display 101 may be formed to be substantially the same as the contour shape of the front plate 102 adjacent thereto. In another embodiment (not illustrated), the distance between the outer contour of the display 101 and the outer contour of the front plate 102 may be substantially constant in order to enlarge the exposed area of the display 101.

In another embodiment (not illustrated), a recess or an opening is formed in a part of a screen display area of the display 101, and at least one of an audio module 114, a module 104, a camera module 105, and a light-emitting element 106 may be aligned with the recess or the opening. In another embodiment (not illustrated), at least one of the audio module 114, the sensor module 104, the camera module 105, the fingerprint sensor 116, and the light-emitting element 106 may be included in the rear face of the screen display area of the display 101. In another embodiment (not illustrated), the display 101 may be coupled to or disposed adjacent to a touch-sensing circuit, a pressure sensor capable of measuring the intensity of the touch (pressure), and/or a digitizer that detects a stylus pen. In some embodiments, at least some of the sensor modules 104 and 119 and/or at least some of the key input devices 117 may be disposed in the first areas 110D and/or the second areas 110E.

The audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker).

The sensor modules 104, 116, and 119 may generate electrical signals or data values corresponding to an internal operating state or an external environmental condition of the electronic device 100. The sensor modules 104, 116, and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an HRM sensor) and/or a fourth sensor module 116 (e.g., a fingerprint sensor) disposed on the second face 110B of the housing 110. The fingerprint sensor may be disposed not only on the first face 110A of the housing 110 (e.g., the display 101), but also on the second face 110B. The electronic device 100 may further include at least one of sensor modules (not illustrated) such as a gesture sensor, a gyro sensor, an air pressure sensor, a magnetic sensor, an acceleration sensor, a grip sensor, a color sensor, an infrared (IR) sensor, a biosensor, a temperature sensor, a humidity sensor, and an illuminance sensor.

The camera modules 105, 112, and 113 may include a first camera device 105 disposed on the first face 110A of the electronic device 100 and a second camera device 112 disposed on the second face 110B, and/or a flash 113. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 117 may be disposed on the side face 110C of the housing 110. In another embodiment, the electronic device 100 may not include some or all of the above-mentioned key input devices 117, and a key input device 117, which is not included therein, may be implemented in another form such as a soft key on the display 101. In some embodiments, the key input devices may include a sensor module 116 disposed on the second face 110B of the housing 110.

The light-emitting element 106 may be disposed, for example, on the first face 110A of the housing 110. The light-emitting element 106 may provide, for example, the status information of the electronic device 100 in an optical form. In another embodiment, the light-emitting element 106 may provide a light source that is interlocked with, for example, the operation of the camera module 105. The light-emitting element 106 may include, for example, an LED, an IR LED, and a xenon lamp.

The connector holes 108 and 109 may include a first connector hole 108 capable of accommodating a connector (e.g., a USB connector) for transmitting and receiving power and/or data to and from an external electronic device, and/or a second connector hole 109 capable of receiving a connector (e.g., an earphone jack) for transmitting and receiving an audio signal to and from an external electronic device.

Figure 3:
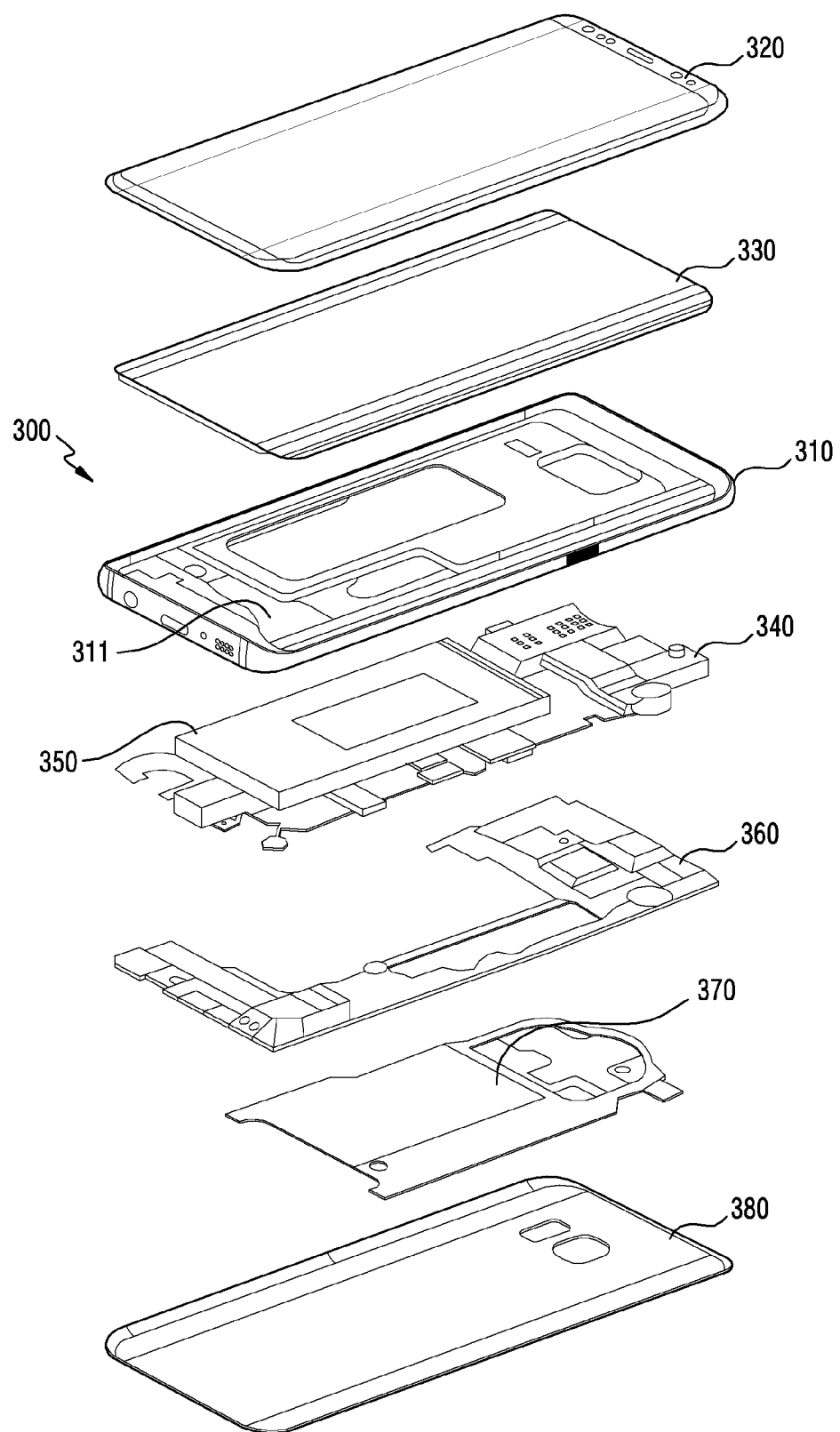
FIG. 3 illustrates an exploded perspective view of the internal configuration of the electronic device of FIG. 1.

FIG. 3 illustrates an exploded perspective view of the internal configuration of the electronic device of FIG. 1.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 300 of FIG. 1 or 2, and a redundant description thereof is omitted below.

The first support member 311 may be disposed inside the electronic device 300 and connected to the side bezel structure 310 or may be formed integrally with the side bezel structure 310. The first support member 311 may be formed of, for example, a metal material and/or a non-metal (e.g., polymer) material. The display 330 may be coupled to one face of the first support member 311, and the printed circuit board 340 may be coupled to the other face of the first support member 332. On the printed circuit board 340, a processor, a memory, and/or an interface may be mounted. The processor may include at least one of, for example, a central processing unit, an application processor, a graphic processor, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed to be substantially flush with, for example, the printed circuit board 340. The battery 350 may be integrally disposed within the electronic device 300, or may be mounted to be detachable from the electronic device 300.

The antenna 370 may be disposed between the rear plate 380 and the display 350. The antenna 370 may include, for example, a near-field Communication (NFC) antenna, a wireless charging antenna, and/or a magnetic secure transmission (MST) antenna. The antenna 370 may perform short-range communication with, for example, an external device, or may transmit/receive power required for charging in a wireless manner to/from the external device. In another embodiment, an antenna structure may be formed by the side bezel structure 310, a part of the first support member 311, or a combination thereof.

Figure 4A:
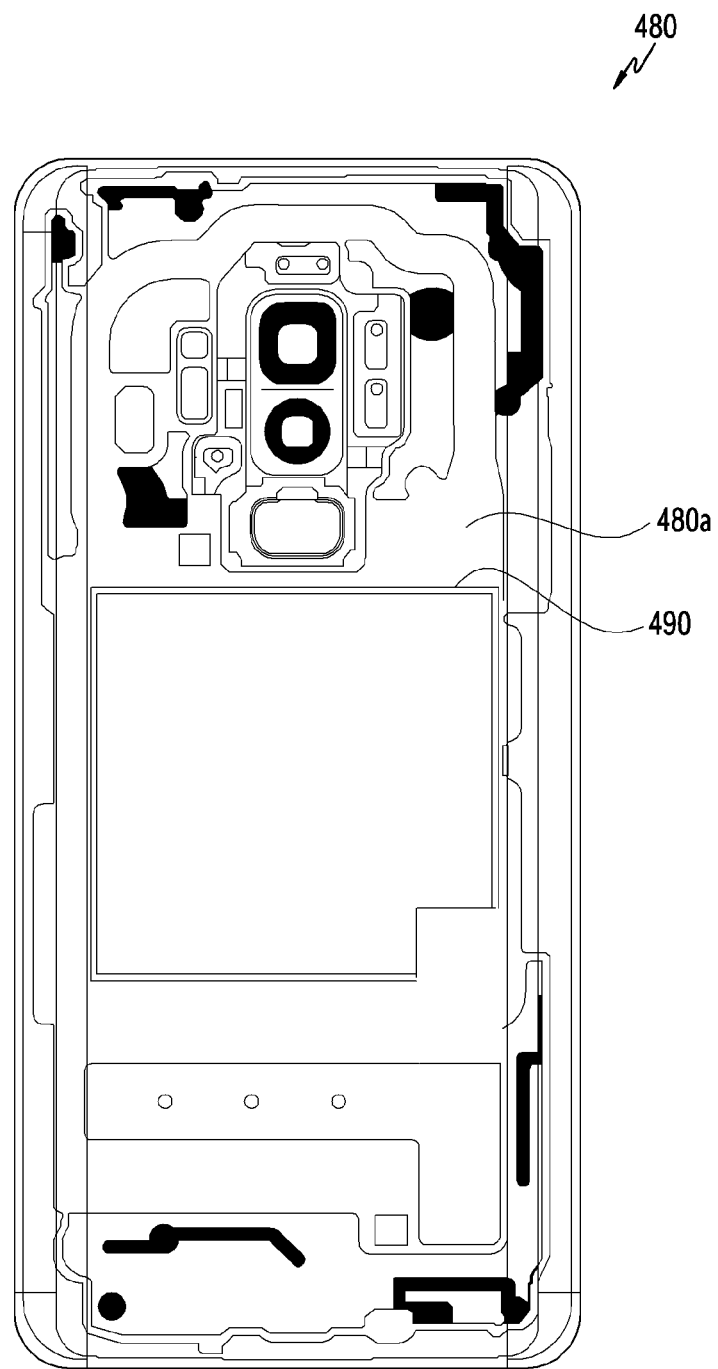
FIG. 4A illustrates a plan view of a rear plate on which a sealing structure according to various embodiments is formed.
Figure 4B:
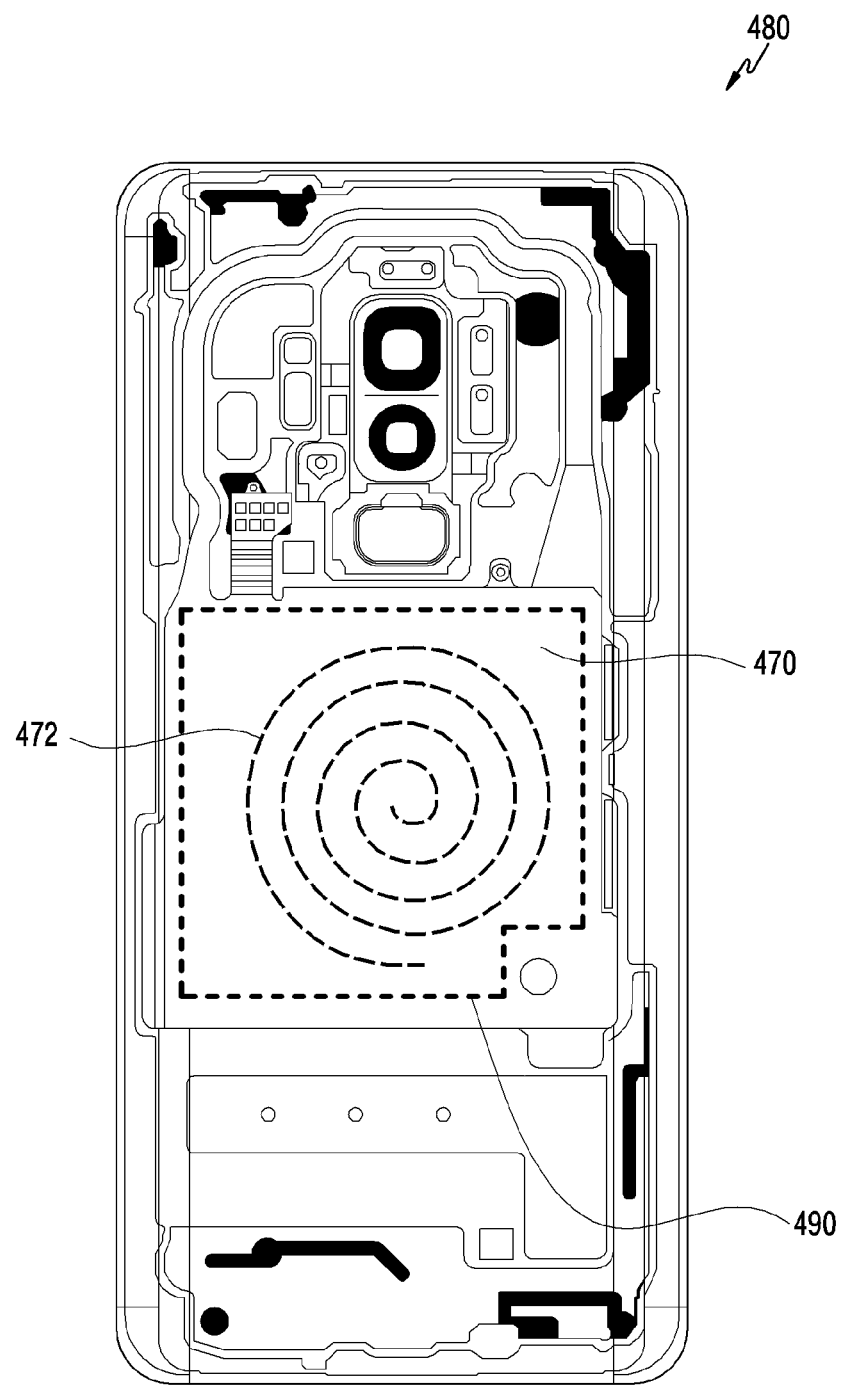
FIG. 4B illustrates a plan view of a rear plate on which a conductive member according to various embodiments is disposed.
Figure 4C:
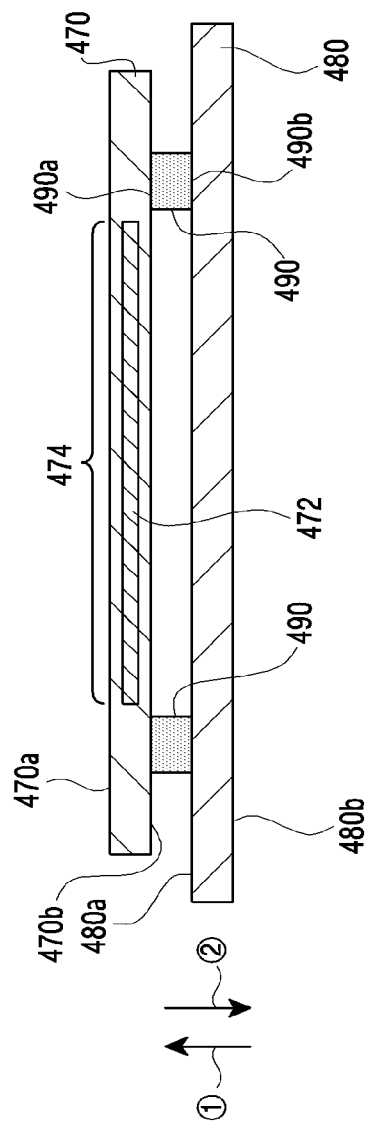
FIG. 4C illustrates a cross-sectional view of the state in which a sealing structure according to various embodiments is disposed.

FIG. 4A illustrates a plan view of a rear plate 480 on which a sealing structure 490 according to various embodiments is disposed. FIG. 4B illustrates a plan view of a rear plate 480 on which a conductive member according to various embodiments is disposed. FIG. 4C illustrates a cross-sectional view of the state in which a sealing structure 490 according to various embodiments is disposed.

Referring to FIGS. 4A to 4C, an electronic device (e.g., the electronic device 100 illustrated in FIG. 1 or the electronic device 300 illustrated in FIG. 3) according to various embodiments may include a conductive member 470 disposed within a housing (e.g., the housing 110 illustrated in FIG. 1 or the housing 310 illustrated in FIG. 3), a rear plate 480, and a sealing structure 490. According to an embodiment, the conductive member 470 may be a wireless charging pad, and may include a protective layer made of insulating material to protect at least one coil 472. For example, the conductive member 470 may be formed in a thin plate shape, and may be disposed between the rear plate 480 and the support structure (e.g., a rear case (the support structure 360 illustrated in FIG. 3). The coil 472 may have a shape in which the coil is wound multiple times, and may have a flat plate shape.

According to an embodiment, the sealing structure 490 may be disposed between the conductive member 470 and the rear plate 480. The sealing structure 490 extends along the edge of the conductive member 470, and may be formed in a closed curve shape when viewed from above the conductive member 470. For example, the sealing structure 490 may have a partition wall structure formed on the rear plate 480, or may be formed in a partition wall shape using an adhesive material. The adhesive material may be applied using a piece of double-sided tape or using a dispensing device. When the sealing structure 490 is formed of an adhesive material, repairing may be convenient.

According to an embodiment, the sealing structure 490 may be formed while avoiding the at least one coil 472. When the conductive member 470 is viewed from above, the sealing structure 490 may be disposed so as not to overlap the at least one coil 472, or may be disposed in a shape that encloses at least one coil 472. The area in which the at least one coil 472 is disposed may not overlap the sealing structure 490.

According to an embodiment, the rear plate 480 may include a first face 480a oriented in a first direction ① and a second face 480*b* oriented in a second direction ②
opposite the first direction ①. The sealing structure 490
may be disposed on the first face 480*a*. According to an
embodiment, the sealing structure 490 may include a first
face 490*a* oriented in a first direction ① and a second face
490*b* oriented in a second direction ②. The first face 490*a*
of the sealing structure 490 may be in close contact with the
conductive member 470, and the second face 490*b* may be
in close contact with the first face 480*a* of the rear plate 480.
According to an embodiment, the sealing structure 470 may
include a first face 470*a* oriented in a first direction ① and
a second face 470*b* oriented in a second direction ②.

According to an embodiment, the sealing structure 490
may be disposed on the first face 480*a* of the rear plate 480
in a protruding shape having a thickness in the first direction
①. For example, the sealing structure 490 may be made of
an injection-molded material or an adhered material to have
a thickness. For example, if the sealing structure 490 is made
of an injection-molded material, the sealing structure 490
may be injection-molded integrally with the rear plate 480,
and if the sealing structure 490 is made of an attached
material, the sealing structure 490 may be attached to the
rear plate 480 or the conductive member 470 using a piece
of double-sided tape. According to an embodiment, the
sealing structure 490 may be formed to have a uniform
thickness.

Figure 5A:
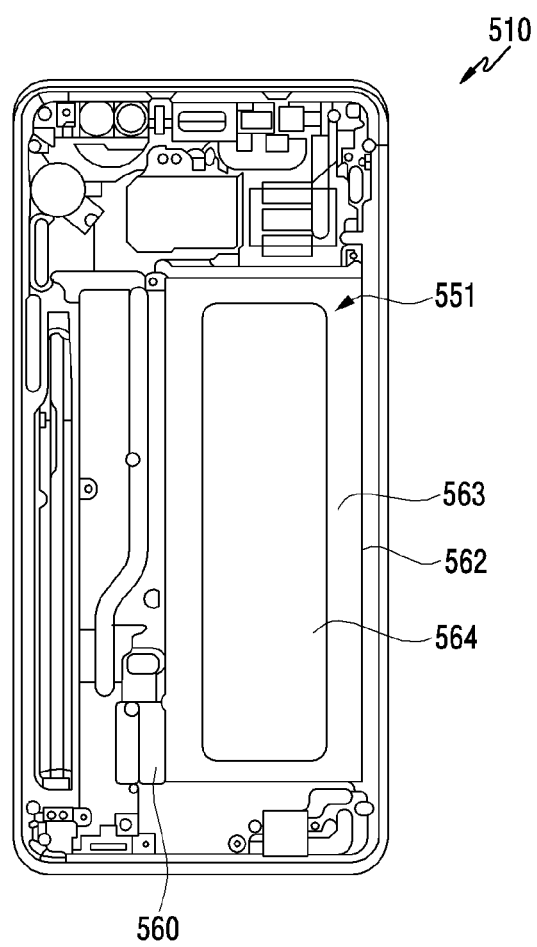
FIG. 5A illustrates a plan view of a battery accommodation portion formed in a support structure of a housing according to various embodiments.

FIG. 5A illustrates a plan view illustrating a battery
accommodation portion formed in a support structure of a
housing according to various embodiments.

Referring to FIG. 5A, according to various embodiments,
a housing 510 may include an accommodation portion 551
of a battery 550. For example, at least a portion of the
housing 510 may be a support structure 560, and at least a
portion of the housing may be a rear case. A battery
accommodation portion 551 may be formed in a portion of
the support structure 560.

According to an embodiment, the battery accommodation
portion 551 may include a guide rib 562, a seating face 563,
and an opening 564. The guide rib 562 may be formed in a
vertical wall shape along the edges of the battery accommodation space so as to support the accommodated battery.
The seating face 563 according to an embodiment may be a
portion of the support structure that supports the received
battery. The opening 564 may be a hole formed in consideration of the swelling of the received battery.

Figure 5B:
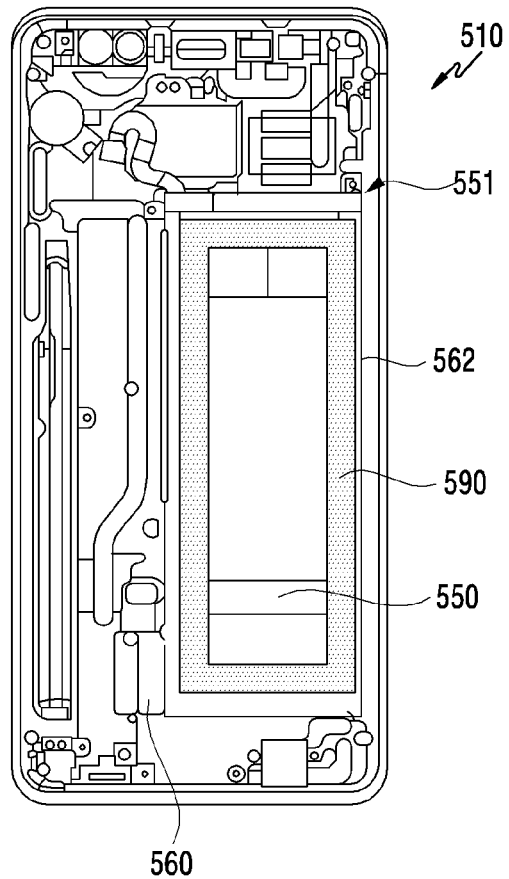
FIG. 5B illustrates a plan view of the state in which a first sealing structure is formed on one face of a battery seated in a battery accommodation portion according to various embodiments.
Figure 5C:
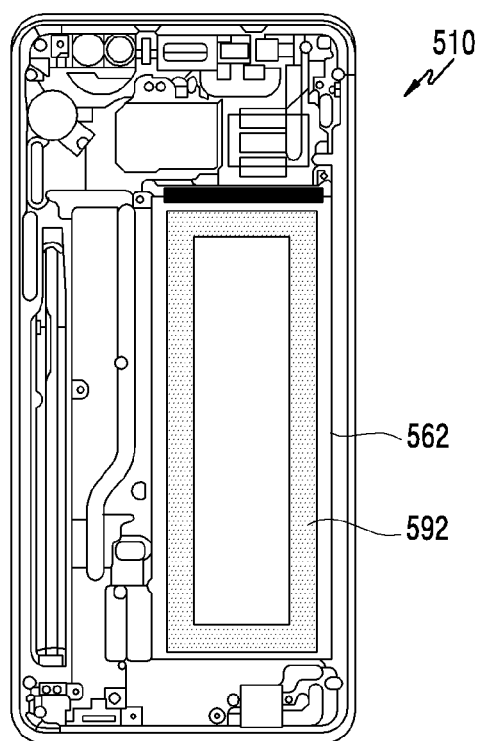
FIG. 5C illustrates a plan view of the state in which a second sealing structure is formed on a seating face of a battery accommodation portion according to various embodiments.
Figure 5D:
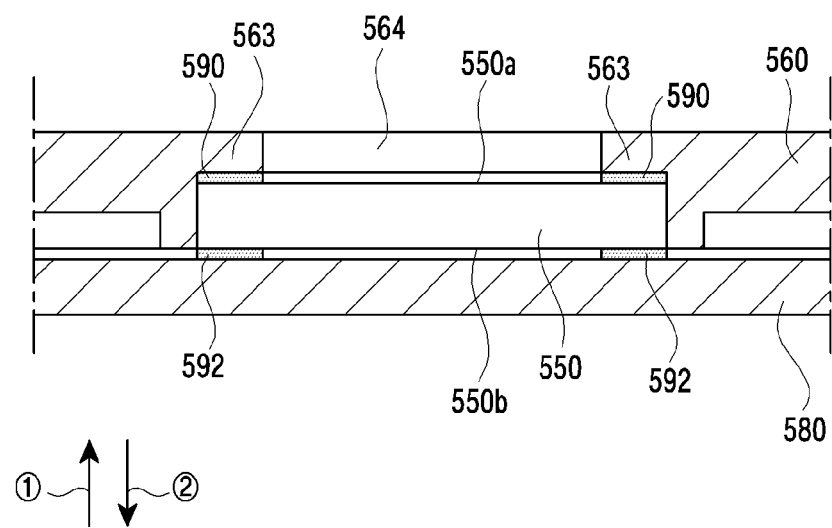
FIG. 5D illustrates a cross-sectional view of the state in which the first and second sealing structures according to various embodiments are disposed.

FIG. 5B illustrates a plan view of the state in which a first
sealing structure is formed on one face of a battery seated in
a battery accommodation portion according to various
embodiments. FIG. 5C illustrates a plan view of the state in
which a second sealing structure is formed on a seating face
of a battery accommodation portion according to various
embodiments. FIG. 5D illustrates a cross-sectional view of
the state in which the first and second sealing structures
according to various embodiments are disposed.

Referring to FIGS. 5B to 5D, according to an embodiment, the housing 510 may include one or more sealing
structures 590 and 592 between the battery 550 and the
support structure 560. According to an embodiment, a first
sealing structure 590 may be disposed between the support
structure 560 and the battery 550, and a second sealing
structure 592 may be disposed between the battery 550 and
the rear plate 580.

According to an embodiment, the first sealing structure
590 may extend continuously along the edges of the first
face 550*a* of the battery 550, and may form a closed curve
shape when viewed from above the first face 550*a* of the
battery 550. For example, the first sealing structure 490 may
include an elastic material or an adhesive material. The
adhesive material may be a piece of double-sided tape. The
battery accommodation portion 551 formed in the support
structure 560 may include a seating face 563, and the first
sealing structure 590 may be disposed on the seating face
563. The first sealing structure 590 may be positioned
between the seating face 563 and the edges of the first face
550*a* of the battery.

According to an embodiment, the second sealing structure
592 may be disposed between the second face 550*b* of the
battery 550 and the rear plate 580. The second sealing
structure 592 may extend continuously along the edges of
the second face 550*b* of the battery 550, and may form a
closed curve shape when viewed from above the second face
550*b* of the battery 550. For example, the second sealing
structure 592 may include an elastic material or an adhesive
material. The adhesive material may be a piece of double-sided tape. For example, the first and second sealing structures 590 and 592 may be disposed up and down symmetrically or asymmetrically to each other with reference to the
battery 550.

According to an embodiment, by disposing the first and
second sealing structures 590 and 592 along the edges of the
respective first and second faces 550*a* and 550*b*, respectively, the battery 550 may reduce the vibration of the rear
plate 580 located in the sealed space.

Figure 6A:
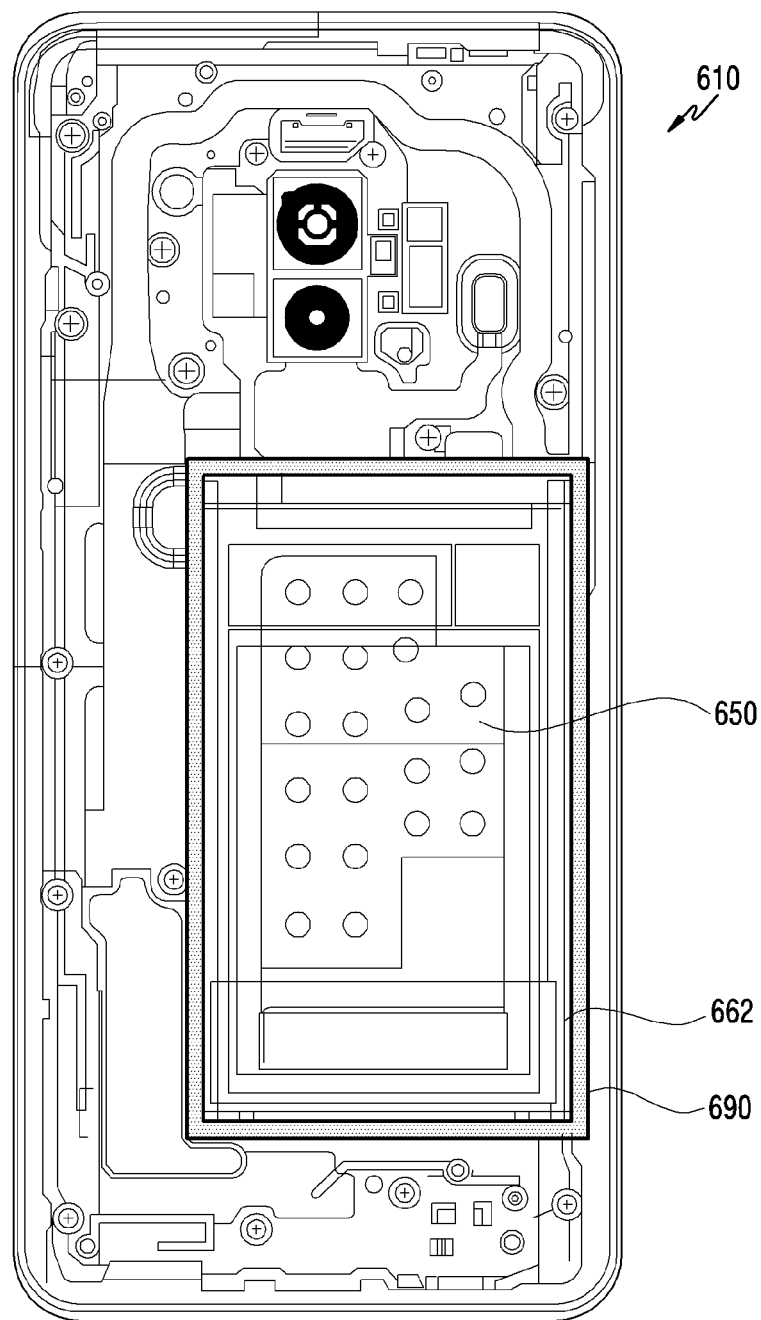
FIG. 6A illustrates a plan view of the state in which a sealing structure is disposed around a battery accommodation portion according to various embodiments.
Figure 6B:
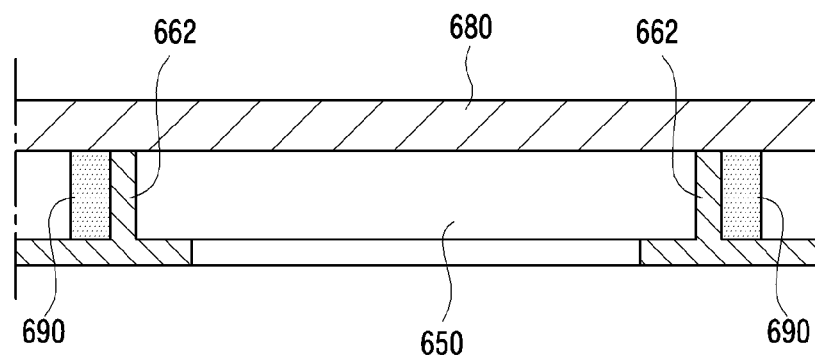
FIG. 6B illustrates a cross-sectional view of the state in which a sealing structure according to various embodiments is disposed.

FIG. 6A illustrates a plan view of the state in which a
sealing structure is disposed around a battery accommodation portion according to various embodiments. FIG. 6B
illustrates a cross-sectional view of the state in which a
sealing structure according to various embodiments is disposed.

Referring to FIGS. 6A and 6B, a housing 610 (e.g., the
housing 510 illustrated in FIG. 5A) according to various
embodiments may include a sealing structure 690 using an
air-blocking material along the periphery of the battery 650.
A sealed space may be formed between the battery 650 and
the rear plate 680 by the sealing structure 690. In the sealed
space formed as described above, since the compression/
expansion force of air generated due to the upper speaker
cannot be transferred to the sealed space by the sealing
structure 690, occurrence of the vibration of the rear plate
680 can be greatly hindered.

The vibration of the rear plate 680 may occur most at the
portion facing the vicinity of the center of the battery 650.
This is caused due to the fact that the rigidity of the rear plate
680 in the vicinity of the battery 650 is weak, and when the
adhesive tape is not applied, the compression/expansion of
air may actively occur. In the case of the upper end of the
rear plate 680, since the camera module, the fingerprint
sensor, or the like exists, the rigidity of the upper end may
be higher than that of the lower end. In consideration of the
structure susceptible to vibration, the sealing structure 690
according to an embodiment may be formed along the
periphery of the battery so as to seal the space between one
face the battery 650 and the rear plate 680.

According to an embodiment, the sealing structure 690
formed around the battery 650, for example, along the guide
rib 662 performs a function of a partition wall structure that
is capable of preventing air flow at the upper end of the
peripheral portion of the battery 650, thereby implementing
a sealed space. For example, the sealing structure 690 may
be formed as a wall-type partition wall structure using an
elastic material or an adhesive material around the battery
650. The height of the partition wall may be formed to have
a height so as to come in to close contact with the rear plate
680. Since the sealed space that faces one face of the battery 650 and the space that does not face the one face of the battery 650 are separated from each other by the sealing structure 690, the occurrence of vibration may be reduced in the rear plate 680 having the sealed space that faces the one face of the battery 650. This is because the sealing structure 690 blocks air flow, e.g., vibration.

Figure 7A:
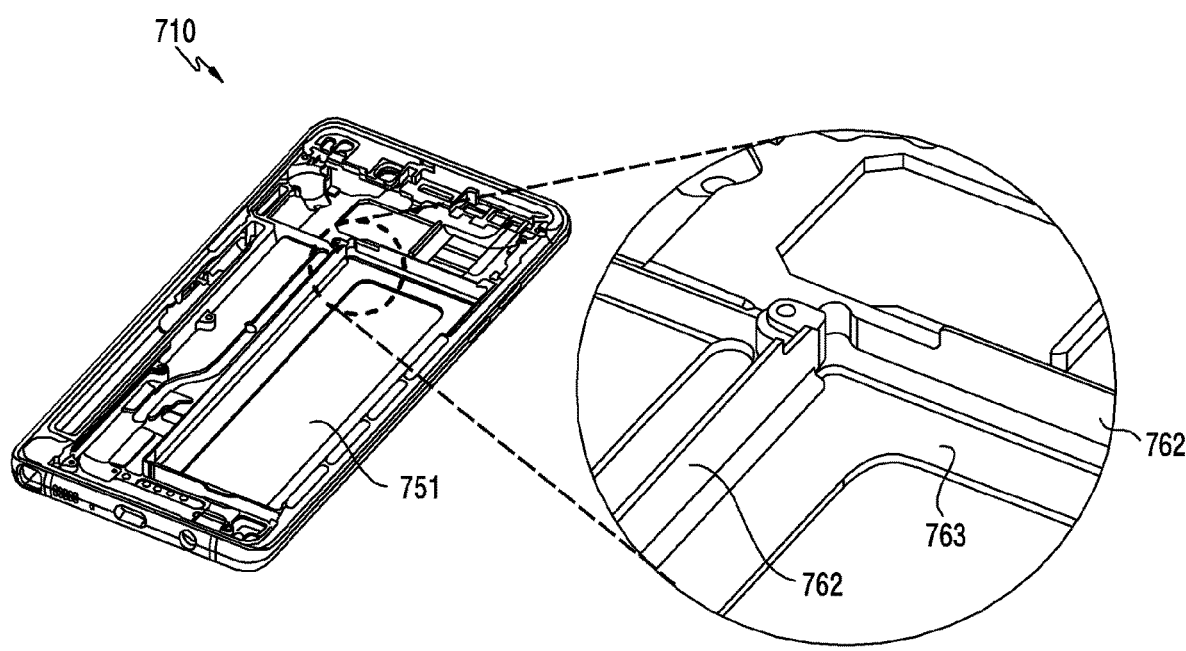
FIG. 7A illustrates a perspective view of a position where a sealing structure is formed on the upper end of a guide rib according to various embodiments.
Figure 7B:
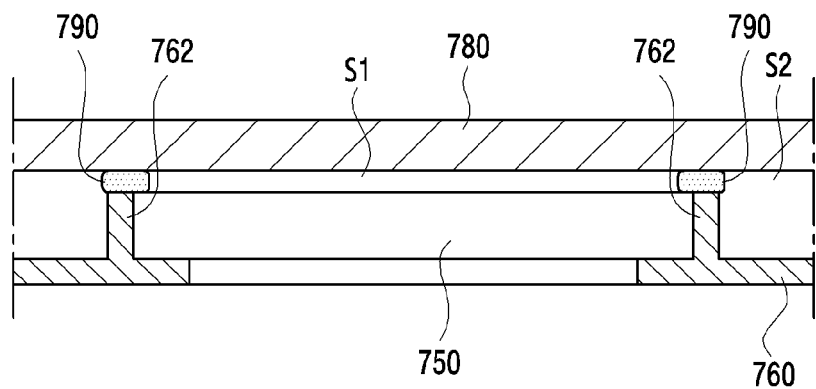
FIG. 7B illustrates a cross-sectional view of the state in which a sealing structure according to various embodiments is disposed.

FIG. 7A illustrates a perspective view of a position where a sealing structure 490 is formed on the upper end of a guide rib according to various embodiments. FIG. 7B illustrates a cross-sectional view of the state in which the sealing structure 490 according to various embodiments is disposed.

Referring to FIGS. 7A and 7B, a housing 710 according to various embodiments may include a battery accommodation portion 751, and the battery accommodation portion 751 may include a guide rib 762 for seating the battery 750. The guide rib 762 may have a vertical wall shape and may surround the battery 750. The guide rib 762 may support the side faces of the accommodated battery 750.

According to an embodiment, the sealing structure 790 may be disposed on the upper end of the guide rib 762, and may be in close contact with a rear plate 780. For example, the sealing structure 790 may be formed using an elastic material, such as rubber, silicon, or an adhesive material. The sealing structure 790 may be formed along the upper end face of the guide rib 762, and may be formed in a closed curve shape when viewed from above the rear plate 780. For example, the sealing structure 790 may be disposed by attaching or fixing a closed curve-shaped rubber to the rear plate 780 corresponding to the upper end face of the guide rib 762.

According to an embodiment, since the sealing structure 790 is divided into a sealed space s1 between one face of the battery 750 and the rear plate 780 and a non-sealed space s2, occurrence of vibration can be reduced in the rear plate 480 having the sealed space s1 facing the one face of the battery 750. This is because the sealing structure 790 blocks air flow, e.g., vibration. The sealing structure 790 may be made of an elastic material, and may be maintained in a squeezed state between the upper end of the guide rib 762 and the rear plate 780.

Figure 8:
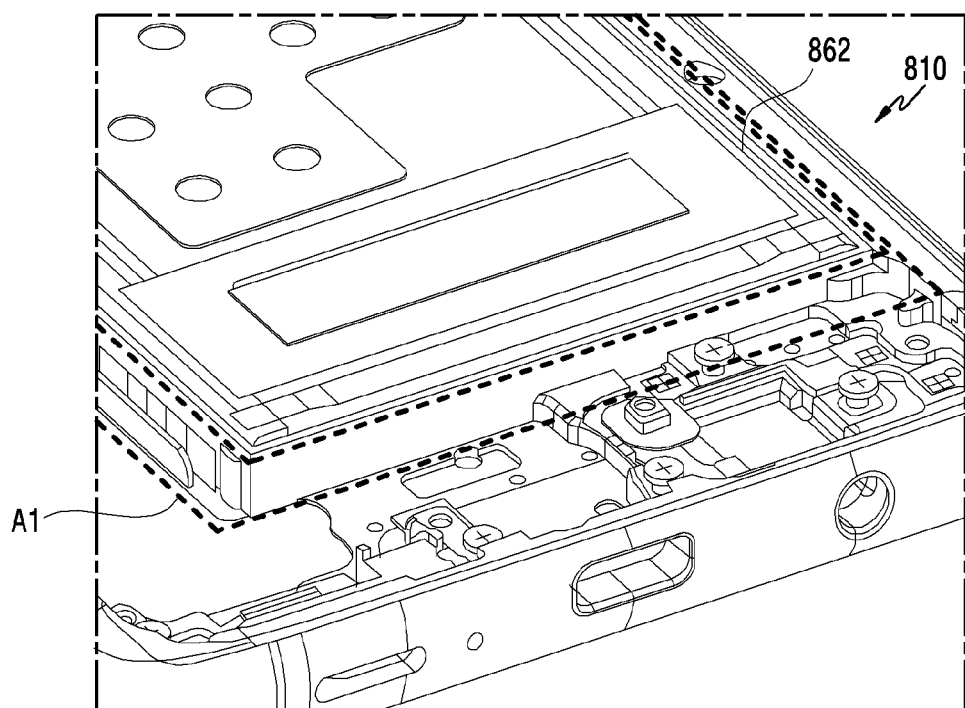
FIG. 8 illustrates a cross-sectional view of an area in which an elastic material is applied to the periphery of a guide rib using a dispensing device according to various embodiments.

FIG. 8 illustrates a cross-sectional view of an area in which an elastic material is applied to the periphery of a guide rib using a dispensing device according to various embodiments.

Referring to FIG. 8, a housing 810 according to various embodiments may have a sealing structure (e.g., the sealing structure 790 illustrated in FIG. 7B) formed along the periphery of the battery (e.g., the battery 750 illustrated in FIG. 7B) through a dispensing process. A liquid adhesive resin may be applied to the periphery A1 of the battery using a dispensing device. According to an embodiment, a guide rib 862 in the periphery A1 of the battery 550 may be formed in a structure that increases the width and height compared to the conventional one. Since the sealed space (e.g., the sealed space s1 illustrated in FIG. 7B) that faces one face the battery 1 and the space that does not face the one face of the battery 1 (e.g., the non-sealed space s2 illustrated in FIG. 7B) are separated from each other by a sealing structure (e.g., the sealing structure 790 illustrated in FIG. 7B) implemented by the curing of the applied liquid adhesive resin, occurrence of vibration can be reduced in the rear plate (e.g., the rear plate 780 illustrated in FIG. 7B) having the sealing space that faces the one face the battery 750. This is because the sealing structure blocks air flow, e.g., vibration.

Figure 9A:
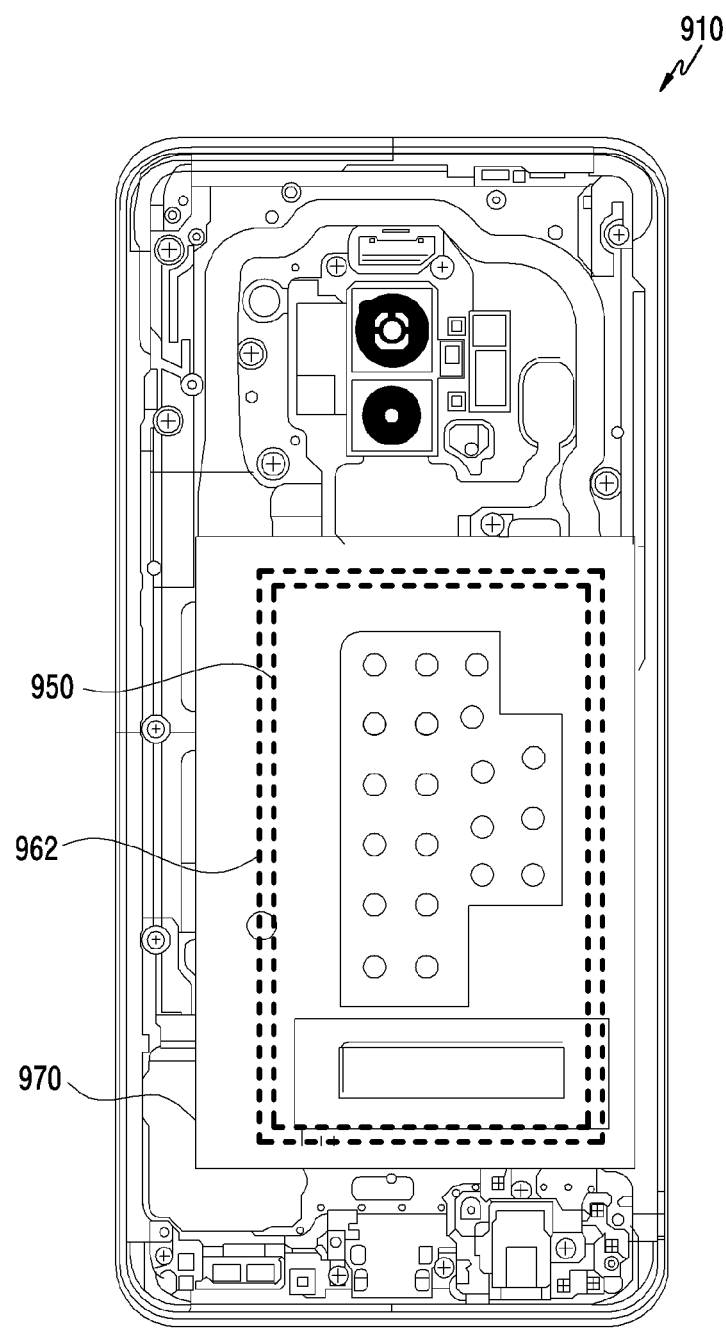
FIG. 9A illustrates a plan view of the state in which a conductive member according to various embodiments is disposed.
Figure 9B:
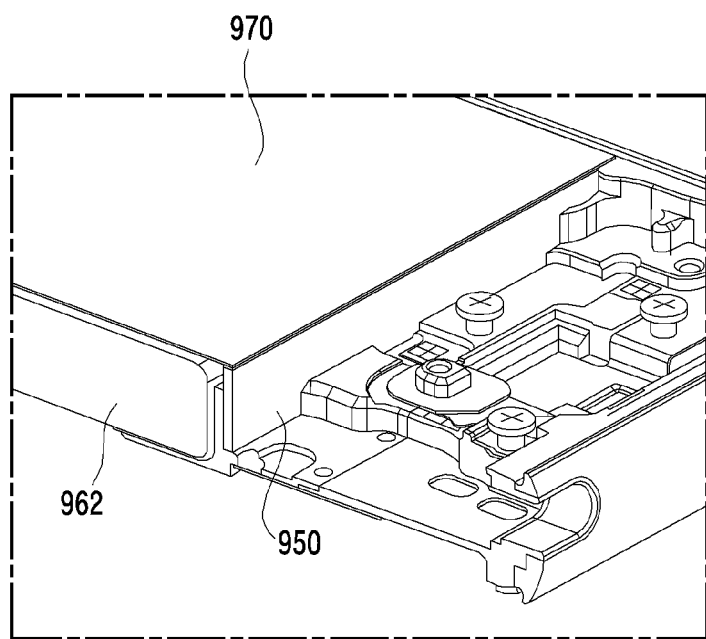
FIG. 9B illustrates a perspective view of a part of the state in which a conductive member and a battery according to various embodiments are disposed.
Figure 9C:
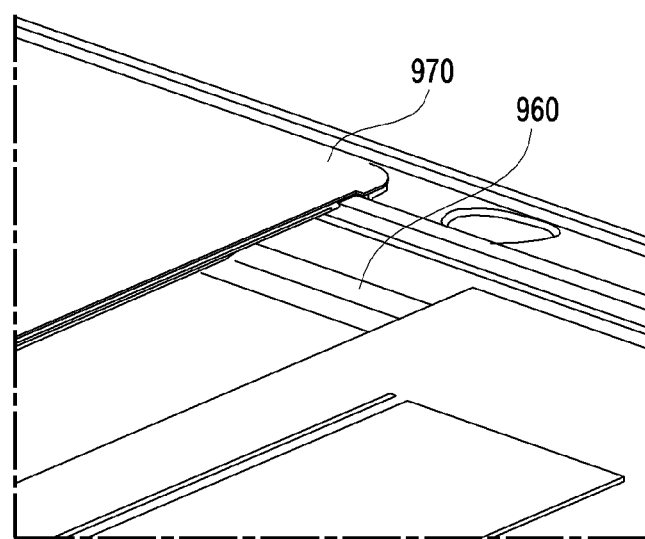
FIG. 9C illustrates a perspective view of the state in which a conductive member according to various embodiments is disposed.
Figure 9D:
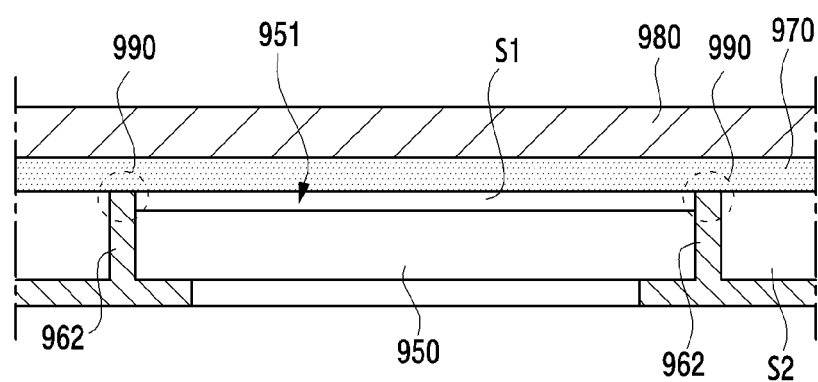
FIG. 9D illustrates a cross-sectional view of a sealing structure according to various embodiments.

FIG. 9A illustrates a plan view of the state in which a conductive member 470 according to various embodiments is disposed. FIG. 9B illustrates a perspective view of a part of the state in which a conductive member 470 and a battery 550 according to various embodiments are disposed. FIG. 9C illustrates a perspective view of the state in which a conductive member 470 according to various embodiments is disposed. FIG. 9D illustrates a cross-sectional view of a sealing structure 490 according to various embodiments.

Referring to FIGS. 9A to 9D, the housing 910 according to various embodiments may include a battery accommodation portion 951, and the battery accommodation portion 951 may be provided with a guide rib 962 so that the battery 950 can be seated in the battery accommodation portion 951. According to an embodiment, a conductive member 970 may be disposed between the battery 950 and the rear plate 980.

According to an embodiment, the conductive member 970 may be a wireless charging pad, and may include at least one coil (e.g., the coil 472 illustrated in FIG. 4B) and a protective layer made of insulating material to protect the at least one coil 472. For example, the conductive member 970 may be formed in a thin plate shape, and may be disposed between the rear plate 980 and one face of the battery 950. The coil (e.g., the coil 472 illustrated in FIG. 4B) may be wound multiple times, and may have a flat plate shape.

The conductive member 970 according to an embodiment may be configured in a shape having an area sufficient to cover the battery 950. When viewed from above the battery 950, the conductive member 970 may be disposed to overlap the battery 950. According to an embodiment, the conductive member 970 may be formed in a shape having an area sufficient to cover the guide rib 962 formed around the battery 950. When viewed from above the battery 950, the conductive member 970 may be disposed to overlap the guide rib 962.

According to an embodiment, the protrusion height of the guide rib 962 formed in the support structure 960 is formed to be slightly larger than the thickness of the battery 950, so that the guide rib 962 can be disposed to come into close contact with the conductive member 970. The upper end of the guide rib 962 and a part of the conductive member 970 may be in close contact with each other in a closed curve shape to provide the sealing structure 990. The sealing structure 990 may be in a compressed state. Since the sealed space s1 that faces one face of the battery 950 and the space s2 that does not face the one face of the battery 950 are separated from each other by the sealing structure 990, the occurrence of vibration may be reduced in the rear plate 980 having the sealed space s1 that faces the one face of the battery 950. This is because the sealing structure 990 blocks air flow, e.g., vibration.

Figure 10:
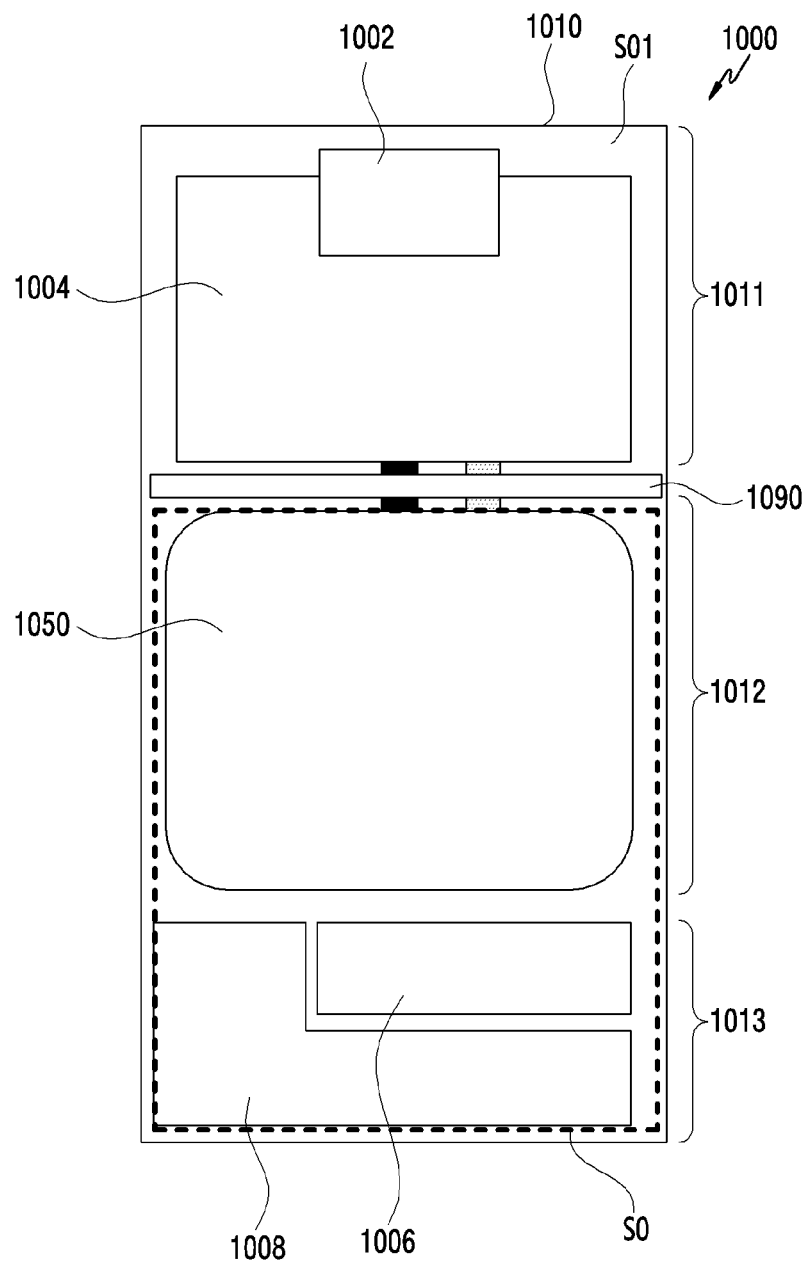
FIG. 10 schematically illustrates a block diagram of a disposed state of components of an electronic device having a large capacity battery according to various embodiments.

FIG. 10 schematically illustrates a block diagram of a disposed state of components of an electronic device having a large capacity battery according to various embodiments.

Referring to FIG. 10, an electronic device 1000 (e.g., the electronic device 100 illustrated in FIG. 1 or the electronic device 300 illustrated in FIG. 3) according to various embodiments may be disposed in the intermediate area 1012 of the housing 1010 in order to increase the capacity of a battery 1050. The battery 1050 may be disposed to have a size sufficient to occupy at least one-third of the housing 1010.

According to an embodiment, the housing 1010 may include an upper area 1011, an intermediate area 1012, and a lower area 1013. The upper area 1011 may have a receiver 1002 disposed at the upper end thereof, and a first printed circuit board 1004 may be disposed adjacent to the receiver (an open-type speaker). The battery 1050 may be disposed in the intermediate area 1012. The battery 1050 may occupy most of the intermediate area 1012. In the lower area 1013, a lower speaker 1008 (a closed-type speaker) may be disposed at the lower end, and a second printed circuit board 1006 may be disposed in the lower area 103. The first printed circuit board 1004, the battery 1050, and the second printed circuit board 1006 may be disposed so as not to overlap each other.

According to an embodiment, a sealing structure 1090 may be disposed at the point where the upper region 1011 and the middle region 1012 are separated from each other. A space s01 in which the receiver 1002 is disposed and a space s0 in which the battery 1050 is disposed may be spatially isolated from each other by the sealing structure 1090. For example, the sealing structure 1090 may extend along one edge of the battery 1050, and may be formed in the housing 1010 in a partition wall type like a vertical wall. However, the sealing structure 1090 is not limited to the partition wall type, and may be formed using an elastic material such as rubber, silicon, or an adhesive material. The sealed space s0 having the battery 1050 therein and the unsealed space s01 having a receiver may be separated from each other by the sealing structure 1090.

According to an embodiment, since the sealing structure is divided into a sealed space s0 in which the battery 1050 is disposed and the non-sealed space s01 in which the receiver 1002 is disposed are separated from each other by the sealing structure 490, occurrence of vibration can be reduced in the rear plate (e.g., the rear plate 480 illustrated in FIG. 4A) having the sealed space facing the one face of the battery 1050. This is because the sealing structure 1090 blocks air flow, e.g., vibration.

Figure 11:
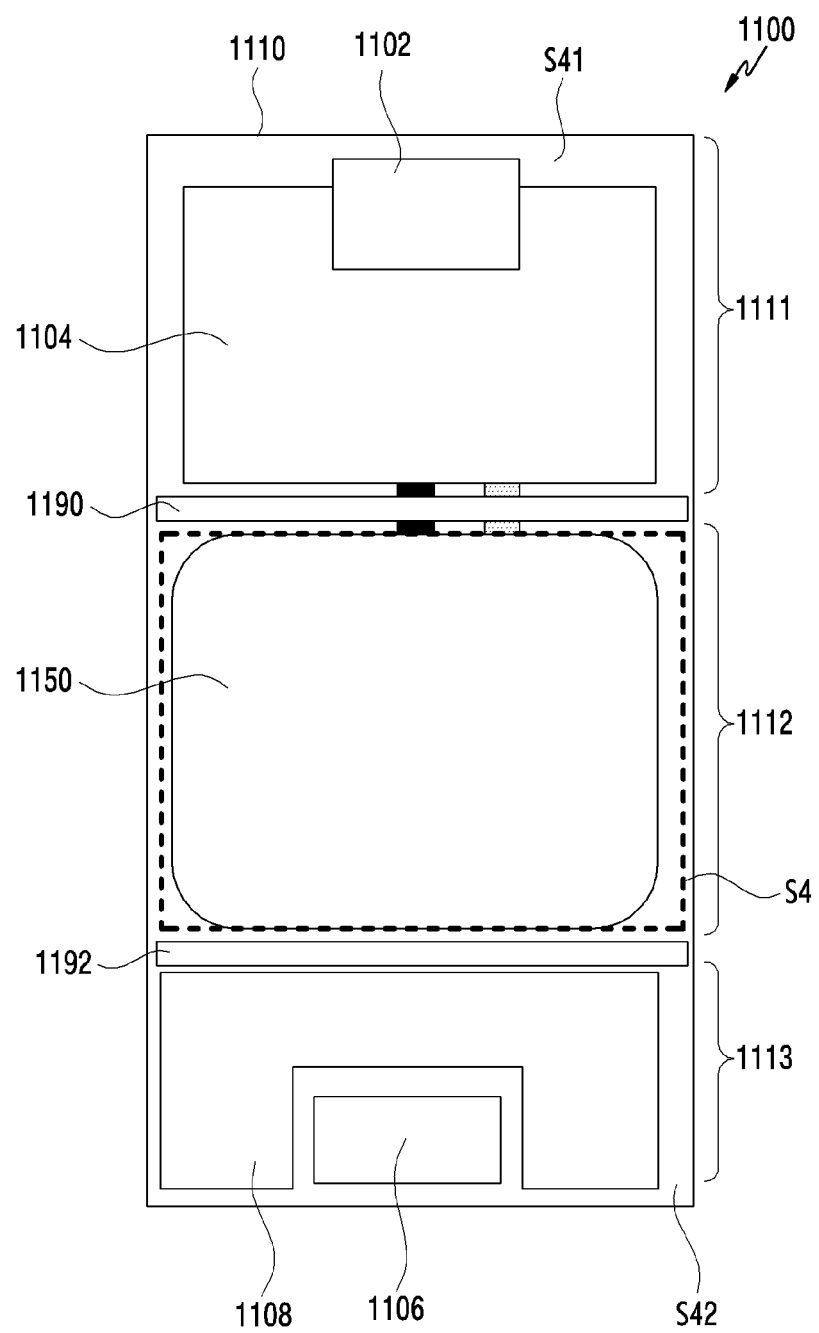
FIG. 11 schematically illustrates a block diagram of a disposed state of components of an electronic device having a large capacity battery according to various embodiments.

FIG. 11 schematically illustrates a block diagram of a disposed state of components of an electronic device having a large capacity battery according to various embodiments.

Referring to FIG. 11, an electronic device 1100 (e.g., the electronic device 1000 illustrated in FIG. 10) according to various embodiments may be disposed in the intermediate area 1112 of a housing 1110 in order to increase the capacity of a battery 1150. The battery 1150 may be disposed to have a size sufficient to occupy at least one-third of the housing 1110.

According to an embodiment, the housing 1110 may include an upper area 1111, an intermediate area 1112, and a lower area 1113. The upper area 1111 may have a receiver 1102 (an open-type speaker) disposed at the upper end thereof, and a first printed circuit board 1104 may be disposed adjacent to the receiver 1102. The battery 1150 may be disposed in the intermediate area 1112. The battery 1150 may occupy most of the intermediate area 1112. In the lower area 1113, a lower speaker 1106 (an open-type speaker) may be disposed at the lower end, and a second printed circuit board 1108 may be disposed in the lower area 1113. The first printed circuit board 1104, the battery 1150, and the second printed circuit board 1108 may be disposed so as not to overlap each other.

According to an embodiment, a first sealing structure 1190 may be disposed at a position at which the upper area 1111 and the intermediate area 1112 are spatially divided, and a second sealing structure 1192 may be disposed at a position at which the intermediate area 1112 and the lower area 1113 may spatially divided. A space s41 in which the receiver 1102 is disposed and a space s4 in which the battery 1150 is disposed may be spatially isolated from each other by the first and second sealing structures 1190 and 1192, and the space s4 in which the battery 1150 is disposed and the space s42 in which the lower stage speaker 1106 is disposed may be spatially isolated from each other by the second sealing structure 1192. For example, the first sealing structure 1190 may extend along one edge of the battery 1150, and may be formed in the housing 1110 in a partition wall type like a vertical wall. The second sealing structure 1192 may extend along another edge of the battery 1150, and may be formed in the housing 1110 in a partition wall type like a vertical wall. However, the first and second sealing structures 1190 and 1192 are not limited to the partition wall type, and may be formed using an elastic material such as rubber, silicon, or an adhesive material. The sealed space s4 having the battery 1150 therein and the unsealed spaces s41 and 42 having a receiver 1102 and a lower speaker 1106 therein may be separated from each other by the sealing structures 1190 and 1192.

According to an embodiment, by the sealing structures 1190 and 1192, occurrence of vibration can be reduced in the rear plate (e.g., the rear plate 480 in FIG. 4A) having the sealed space facing one face of the battery 1050. This is because the first and second sealing structures 1190 and 1192 block air flow, e.g., vibration transferred from the receiver.

Figure 12A:
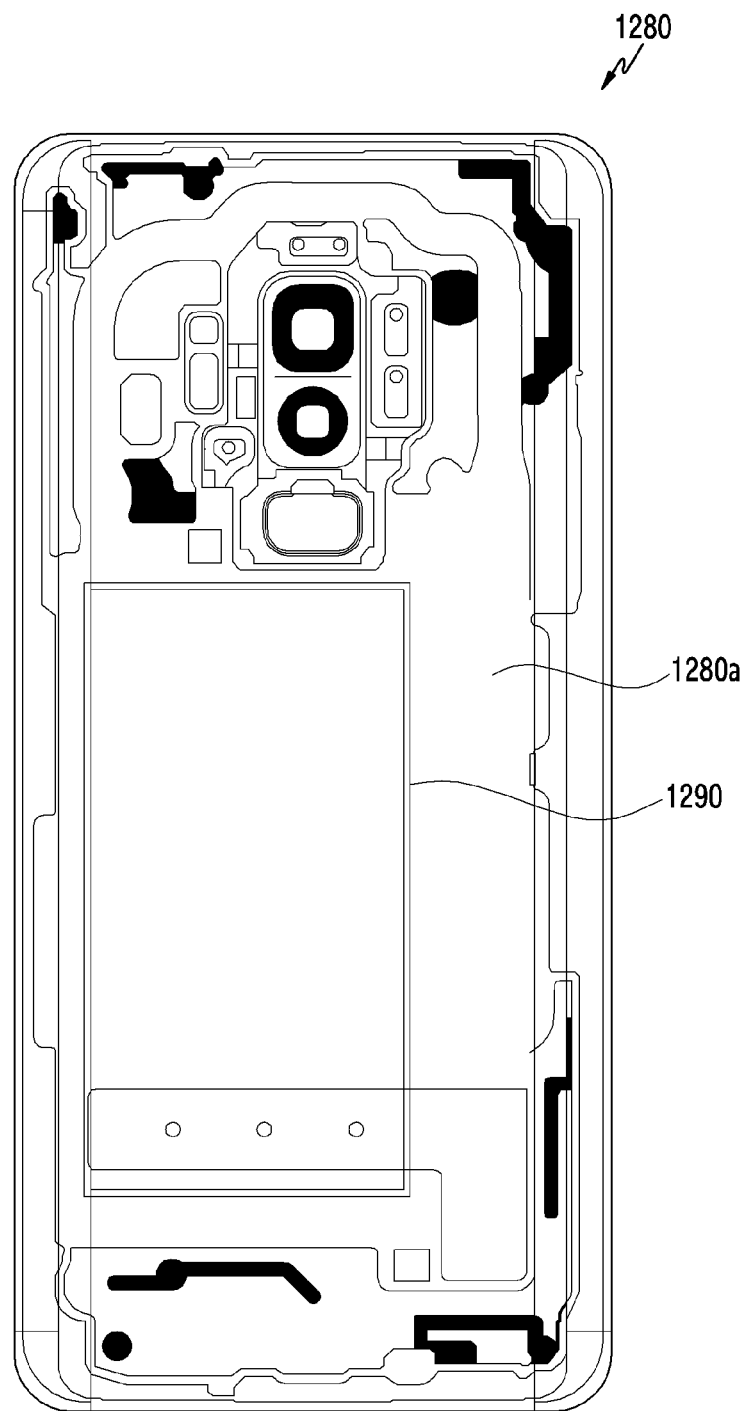
FIG. 12A illustrates a plan view of a rear plate on which a sealing structure according to various embodiments is formed.
Figure 12B:
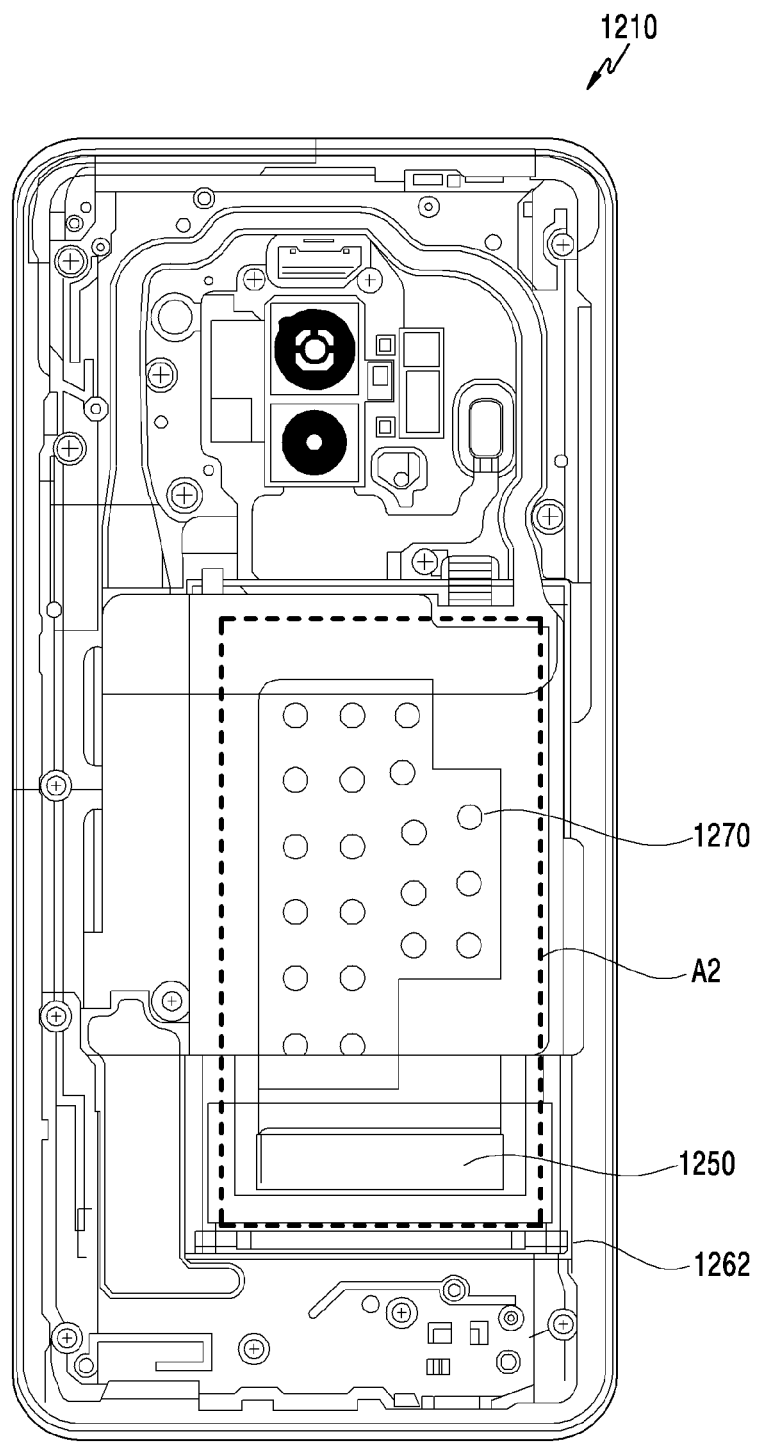
FIG. 12B illustrates a bottom view of a housing on which a conductive member according to various embodiments is disposed.
Figure 12C:
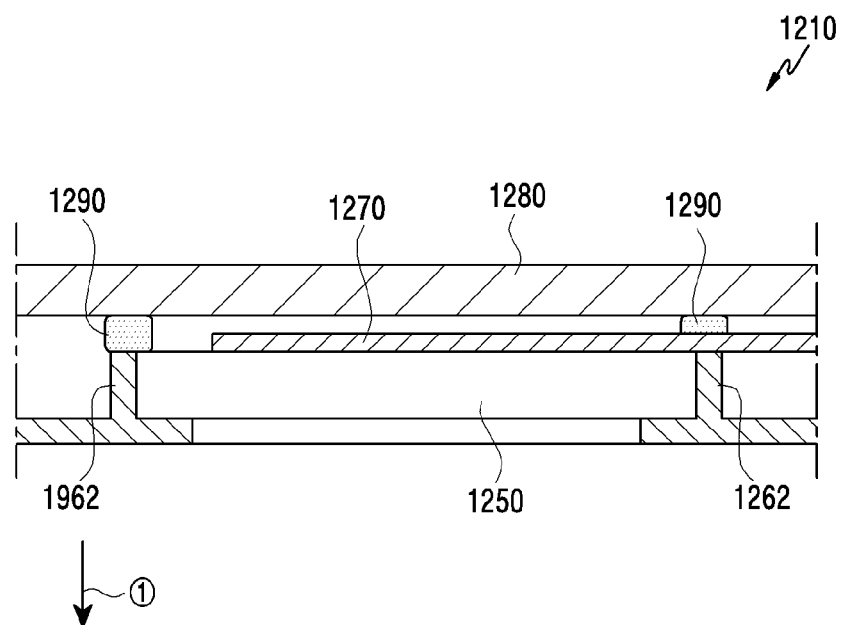
FIG. 12C illustrates a cross-sectional view of the state in which a sealing structure according to various embodiments is disposed.

FIG. 12A illustrates a plan view of a rear plate on which a sealing structure according to various embodiments is formed. FIG. 12B illustrates a bottom view of a housing on which a conductive member according to various embodiments is disposed. FIG. 12C illustrates a cross-sectional view of the state in which a sealing structure 490 according to various embodiments is disposed.

Referring to FIGS. 12A to 12C, an electronic device (e.g., the electronic device 100 illustrated in FIG. 1 or the electronic device 300 illustrated in FIG. 3) according to various embodiments may include a battery 1250 disposed in a housing 1210, a conductive member 1270, a rear plate 1280, and a sealing structure 1290.

According to an embodiment, the sealing structure 1290 may be formed on the rear plate 1280. For example, the sealing structure 1290 may be formed of a piece of double-sided tape using an adhesive material, a stepped structure of an injection-molded material, or a partition wall structure. According to an embodiment, the sealing structure 1290 may be disposed between a part of the battery 1250 and the conductive member 1270 and the rear plate 1280. The sealing structure 1290 may extend along the conductive member 1270 and an edge of the battery 1250, and may be formed in a closed curve shape when viewed from above the conductive member 1270.

According to an embodiment, the sealing structure 1290 may be formed while avoiding at least one coil (e.g., the coil 472 in FIG. 4A). When the conductive member 1270 is viewed from above, the sealing structure 1290 may be disposed so as not to overlap the at least one coil, or may be disposed in a shape that encloses at least one coil 472. The area in which the at least one coil is disposed may not overlap the sealing structure 1290.

According to an embodiment, the sealing structure 1290 may be disposed on the first face 1280a of the rear plate 1280 in a protruding shape having a thickness in the first direction ①. The sealing structure 490 may be formed to have a non-uniform thickness or a uniform thickness. For example, the sealing structure 490 may be disposed in the form of a gasket member made of rubber material.

According to an embodiment, since the sealing structure 1290 is divided into the sealed space in which the battery 1250 is disposed and the non-sealed space in which the battery 1250 is not disposed, occurrence of vibration can be reduced in the rear plate 1280 having the sealed space facing a portion of the conductive member 1270 and one face of the battery 1250. This is because the sealing structure 1290 blocks air flow, e.g., vibration. Reference numeral A2 may denote the location with which the sealing structure 1290 is capable of coming into close contact.

Figure 13A:
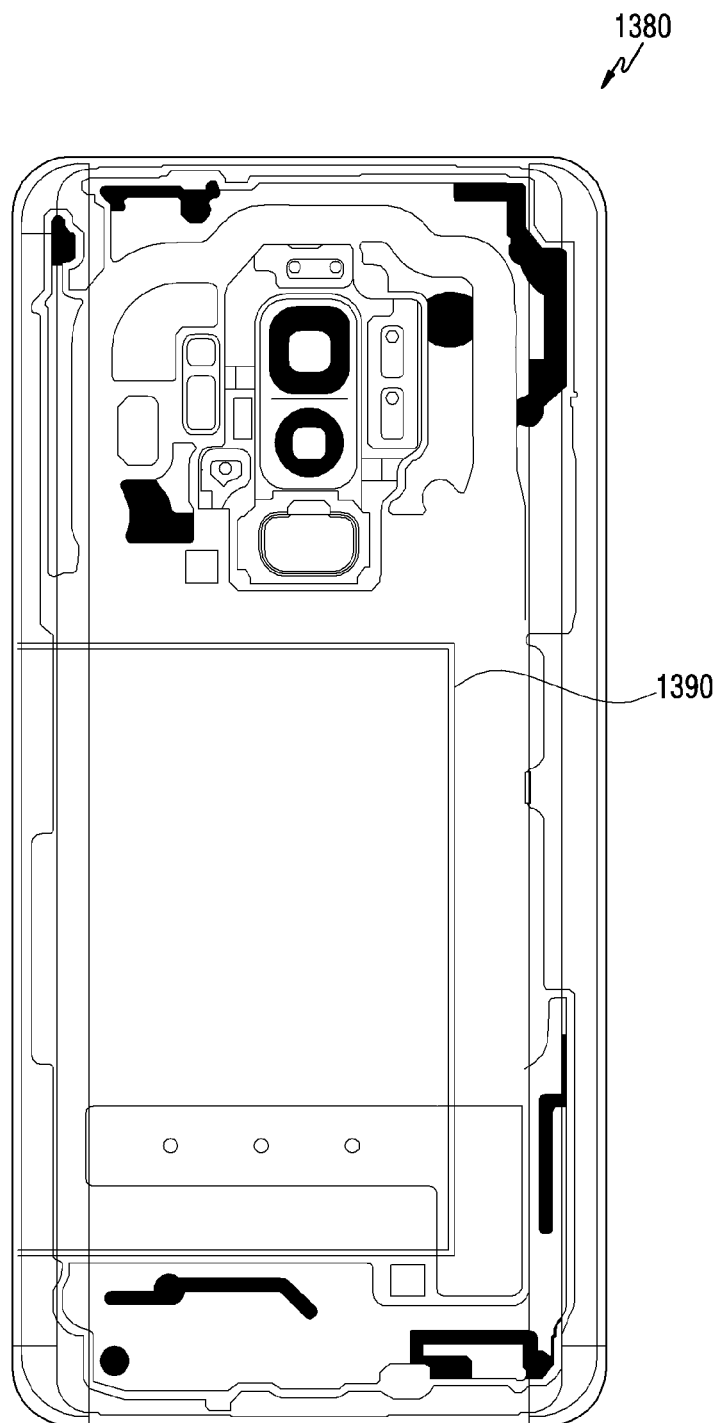
FIG. 13A illustrates a plan view of a rear plate on which a sealing structure according to various embodiments is formed.
Figure 13B:
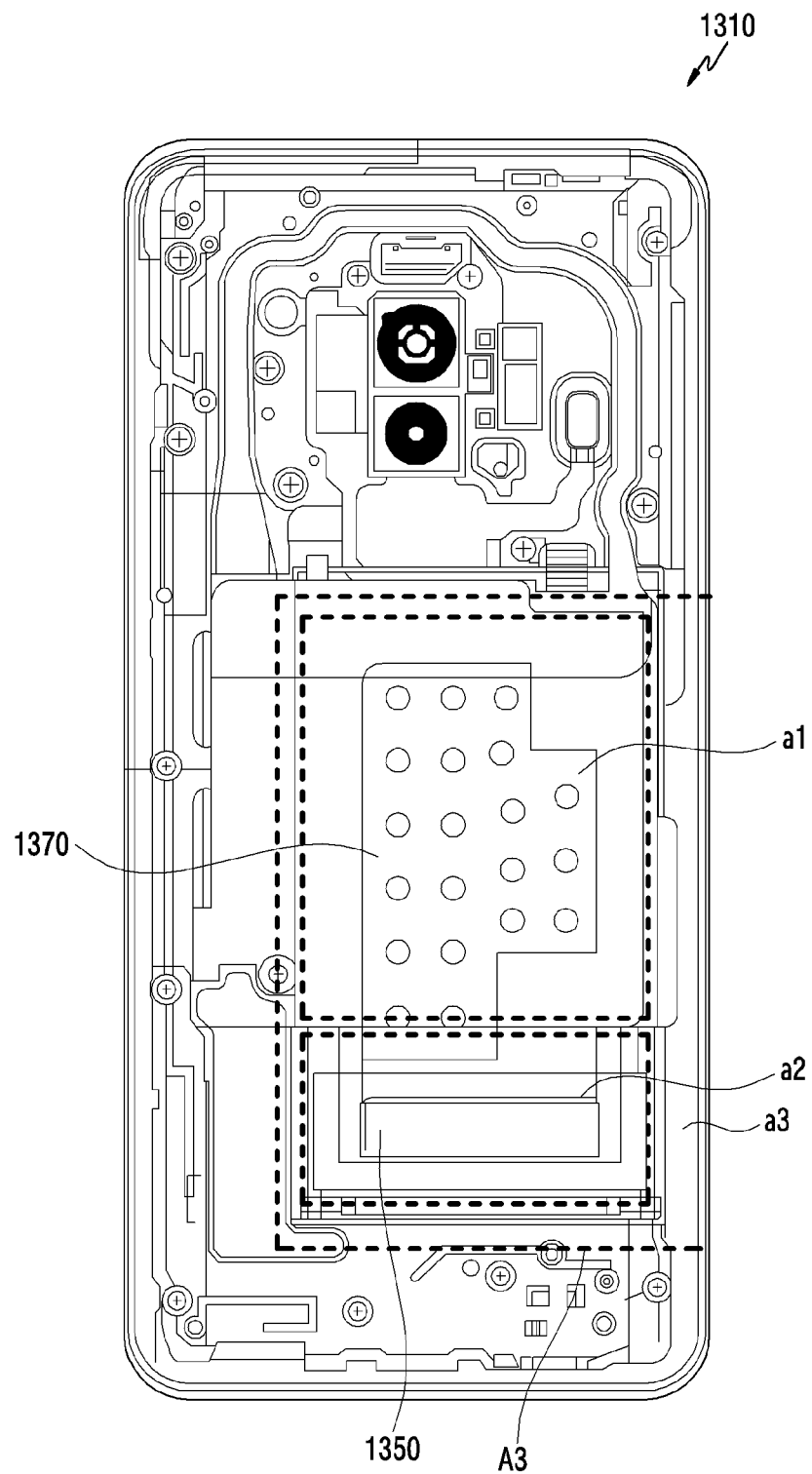
FIG. 13B illustrates a bottom view of a housing on which a conductive member according to various embodiments is disposed.

FIG. 13A illustrates a plan view of a rear plate on which a sealing structure according to various embodiments is formed. FIG. 13B illustrates a bottom view of a housing on which a conductive member according to various embodiments is disposed.

Referring to FIGS. 13A to 13B, an electronic device (e.g., the electronic device 100 illustrated in FIG. 1 or the electronic device 300 illustrated in FIG. 3) according to various embodiments may include a battery 1350 disposed in a housing 1310, a conductive member 1370, a rear plate 1380, and a sealing structure 1390.

According to an embodiment, the sealing structure 1390 may be formed on the rear plate 1380. For example, the sealing structure 1390 may be formed of a piece of double-sided tape using an adhesive material, a stepped structure of an injection-molded material, or a partition wall structure. According to an embodiment, the sealing structure 1390 may be disposed between a part of the battery 1350 and the conductive member 1370 and the rear plate 1380. The sealing structure 1390 may extend along the conductive member 1370 and an edge of the battery 1350.

According to an embodiment, the sealing structure 1390 may be formed while avoiding at least one coil (e.g., the coil 472 in FIG. 4A). When the front plate (e.g., the front plate 320 illustrated in FIG. 3) is viewed from above, the sealing structure 1390 may be disposed so as not to overlap the at least one coil (e.g., the coil 472 in FIG. 4A), or may be disposed in a shape that encloses at least one coil. The area in which the at least one coil (e.g., the coil 472 in FIG. 4A) is disposed may not overlap the sealing structure 1390.

The area sealed by the sealing structure 1390 may include a space sealed by one face of the battery 1350 and the rear plate 1380 and an area sealed by the peripheral area of the battery 1350 and the rear plate 1380. Compared with the space sealed by the sealing structure 1390 illustrated in FIGS. 12A and 12B, the peripheral area a3 of the battery 1350 is added to the area sealed by the sealing structure 1390.

According to an embodiment, the sealing structure 1390 may be disposed on the first face 1380a of the rear plate 1380 in a protruding shape having a thickness in the first direction (e.g., the first direction ① illustrated in FIG. 12C). The sealing structure 1390 may be formed to have a non-uniform thickness or a uniform thickness. For example, the sealing structure 1390 may be disposed in the form of a gasket member of made of a rubber material, may be formed as a stepped structure, or may be formed to have a thickness using an adhesive material.

According to an embodiment, with the sealing structure 1390, occurrence of vibration can be reduced in the rear plate 1380 facing an area a1 having the conductive member, an area a2 having the battery 1350, and a peripheral area a3 of the battery 1350. This is because the sealing structure 1390 blocks air flow, e.g., vibration. Reference numeral A3 may denote the location with which the sealing structure 1390 is capable of coming into close contact.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
  a housing including:
    a front plate oriented in a first direction, and
    a rear plate oriented in a second direction opposite the first direction;
  a display disposed such that at least a portion thereof is visible through the front plate;
  a printed circuit board disposed between the display and the rear plate;
  a support structure including:
    a first face oriented in the first direction and supporting the display, and
    a second face oriented in the second direction and supporting the printed circuit board;
  a conductive member disposed between the support structure and the rear plate; and
  a sealing structure disposed between the conductive member and the rear plate,
  wherein:
    the housing has an open-type speaker disposed at an upper end of the front plate, and
    vibration transferred from the open-type speaker is blocked by the sealing structure so as not to be transferred to a portion of the rear plate facing the conductive member.

2. The electronic device of claim 1, wherein the conductive member includes a wireless charging pad.

3. The electronic device of claim 2, wherein:
  the wireless charging pad includes at least one coil, and
  the sealing structure is disposed while avoiding the at least one coil.

4. The electronic device of claim 3, wherein the sealing structure is formed in a shape that encloses the at least one coil.

5. The electronic device of claim 3, wherein the sealing structure and the at least one coil are disposed so as not to overlap each other when viewed from above the front plate.

6. The electronic device of claim 1, wherein the rear plate includes a rear glass.

7. The electronic device of claim 1, wherein:
  the rear plate includes a first face oriented in the first direction and a second face oriented in the second direction, and
  the sealing structure includes a stepped structure formed on the first face of the rear plate or a partition wall structure made of an adhesive material.

8. The electronic device of claim 7, wherein the partition wall structure is formed on the first face of the rear plate in a shape protruding in the first direction.

9. The electronic device of claim 1, wherein:
  the rear plate includes a first face oriented in the first direction and a second face oriented in the second direction, and
  the sealing structure includes a piece of double-sided adhesive tape attached to the first face of the rear plate.

10. The electronic device of claim 1, wherein:
  the sealing structure has a uniform thickness, the sealing structure includes a first face oriented in the first direction and a second face oriented in the second direction, and
  the first face of the sealing structure is in close contact with the conductive member, and the second face of the sealing structure is in close contact with the rear plate.

11. An electronic device comprising:
  a housing including:
    a front plate oriented in a first direction, a rear plate oriented in a second direction opposite the first direction, and a side member enclosing at least a part of a space between the front plate and the rear plate;

a display disposed such that at least a portion thereof is visible through the front plate;

a printed circuit board disposed between the display and the rear plate;

a support structure including:
  a first face oriented in the first direction and supporting the display,
  a second face oriented in the second direction and supporting the printed circuit board, the support structure being coupled to at least a portion of the housing, and
  a guide rib extending vertically from the second face;

a battery disposed parallel to the printed circuit board so as not to overlap the printed circuit board, the battery being directly supported by the guide rib in an accommodation portion in the support structure; and a conductive member disposed between the support structure and the rear plate, the conductive member having an area sufficient to cover the battery, wherein an upper edge of the guide rib is in close contact with the conductive member so as to form a closed curve to provide a sealing structure disposed between the support structure and the battery and extending along an edge of the battery, wherein the conductive member includes a wireless charging pad, and wherein:
  the wireless charging pad includes at least one coil, and
  the sealing structure is disposed while avoiding the at least one coil.

12. The electronic device of claim 11, wherein:
the battery includes a first face oriented in the first direction and a second face oriented in the second direction, and
the sealing structure is disposed between the support structure and the first face.

13. The electronic device of claim 12, wherein the sealing structure continuously extends along the edge of the battery when viewed from above the first face of the battery, and
wherein the sealing structure is formed in a closed curve shape.

14. The electronic device of claim 11, wherein the sealing structure includes an elastic material or an adhesive material.

15. The electronic device of claim 11, wherein the rear plate includes a rear glass.

* * * * *